(12) United States Patent
Iwamoto et al.

(10) Patent No.: US 7,561,999 B2
(45) Date of Patent: Jul. 14, 2009

(54) VERIFICATION APPARATUS, VERIFICATION METHOD, AND PROGRAM

(75) Inventors: Masami Iwamoto, Kawasaki (JP); Yuichi Ozawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 271 days.

(21) Appl. No.: 10/852,241

(22) Filed: May 25, 2004

(65) Prior Publication Data

US 2005/0102640 A1     May 12, 2005

(30) Foreign Application Priority Data

Nov. 10, 2003     (JP)     ............................. 2003-379532

(51) Int. Cl.
    *G06F 17/50*     (2006.01)
(52) U.S. Cl. ............................. 703/14; 703/16; 703/17; 716/4
(58) Field of Classification Search .................. 703/14, 703/15, 21, 22, 28, 9, 16, 17; 716/4–6; 714/720, 714/33, 741
See application file for complete search history.

(56) References Cited

U.S. PATENT DOCUMENTS

| | | | | |
|---|---|---|---|---|
| 5,991,529 A * | 11/1999 | Cox et al. | ........................ | 703/9 |
| 5,991,533 A * | 11/1999 | Sano et al. | ..................... | 703/28 |
| 6,052,524 A * | 4/2000 | Pauna | ........................... | 703/22 |
| 6,188,975 B1 * | 2/2001 | Gay | .............................. | 703/22 |
| 6,212,489 B1 * | 4/2001 | Klein et al. | .................... | 703/13 |
| 6,467,056 B1 * | 10/2002 | Satou et al. | .................. | 714/720 |
| 6,510,541 B1 * | 1/2003 | Fujiwara et al. | ................ | 716/5 |
| 6,532,573 B1 * | 3/2003 | Kurosaka | ........................ | 716/5 |
| 6,536,031 B2 * | 3/2003 | Ito et al. | ........................ | 716/18 |
| 6,634,017 B2 * | 10/2003 | Matsui et al. | .................. | 716/11 |
| 6,810,373 B1 * | 10/2004 | Harmon et al. | ................ | 703/14 |
| 6,817,001 B1 * | 11/2004 | Kudlugi et al. | .................. | 716/6 |
| 6,925,617 B2 * | 8/2005 | Bayraktaroglu et al. | ........ | 716/4 |
| 6,959,271 B1 * | 10/2005 | Ballam | ........................ | 703/14 |
| 2003/0208730 A1 * | 11/2003 | Singhal et al. | .................. | 716/4 |
| 2003/0229483 A1 * | 12/2003 | Boland et al. | .................. | 703/19 |
| 2003/0237062 A1 * | 12/2003 | Whitehill | ........................ | 716/4 |

(Continued)

OTHER PUBLICATIONS

Patent Abstracts of Japan, Publication No. 10-261002, Published Sep. 29, 1998.

(Continued)

*Primary Examiner*—Paul L Rodriguez
*Assistant Examiner*—Kandasamy Thangavelu
(74) *Attorney, Agent, or Firm*—Staas & Halsey LLP (57) ABSTRACT

A verification apparatus that efficiently performs hardware verification and software verification in the development of a system LSI with great accuracy. At the hardware verification, an equivalence verification section compares the result of the simulation of an HDL model by a logic simulator and an expected value generated from an expected value calculation model and verifies whether there is equivalence between them. At the software verification, the expected value calculation model is used via an interface section and a firmware is verified by a software debugger. The expected value calculation model is used as an expected value generation model at hardware verification time and is used as a C model of hardware at software verification time. By using the expected value calculation model both for the hardware verification and for the software verification in this way, verification can efficiently be performed with great accuracy.

10 Claims, 5 Drawing Sheets

U.S. PATENT DOCUMENTS

2004/0078178 A1* 4/2004 Blasi et al. .................. 703/15
2004/0093572 A1* 5/2004 Jain et al. .................... 716/5
2004/0153301 A1* 8/2004 Isaacs et al. ................. 703/14
2004/0158788 A1* 8/2004 Kaszynski et al. .......... 714/741
2005/0022058 A1* 1/2005 Fechser ....................... 714/33

OTHER PUBLICATIONS

Patent Abstracts of Japan, Publication No. 2000-113021, Published Apr. 21, 2000.
Patent Abstracts of Japan, Publication No. 2002-244639, Published Aug. 30, 2002.

* cited by examiner

| FLAG | | | ADDRESS | DATA |
|---|---|---|---|---|
| FUNCTION ACCURATE LEVEL | TRANSACTION ACCURATE LEVEL | CYCLE ACCURATE LEVEL | | |
| 0 | 0 | 0 | 0x0 | 80 |
| | | 1 | 0x1 | bb |
| | | 2 | 0x2 | 7c |
| | | 3 | 0x3 | bc |
| | 1 | 4 | 0x4 | 80 |
| | | 5 | 0x5 | bd |
| | | 6 | 0x6 | 7c |
| | | 7 | 0x7 | be |
| 1 | 2 | 8 | 0x8 | 7f |
| | | 9 | 0x9 | 29 |
| | | 10 | 0xA | 83 |
| | | 11 | 0xB | 28 |
| | 3 | 12 | 0xC | 7a |
| | | 13 | 0xD | 32 |
| | | 14 | 0xE | 82 |
| | | 15 | 0xF | 3a |

VERIFICATION APPARATUS, VERIFICATION METHOD, AND PROGRAM

CROSS-REFERENCE TO RELATED APPLICATIONS

This application is based upon and claims the benefits of priority from the prior Japanese Patent Application No. 2003-379532, filed on Nov. 10, 2003, the entire contents of which are incorporated herein by reference.

BACKGROUND OF THE INVENTION (1) Field of the Invention

This invention relates to a verification apparatus, verification method, and program and, more particularly, to a verification apparatus, verification method, and program for developing and verifying hardware and software for a system large scale integrated circuit (LSI).

(2) Description of the Related Art

In recent years a long time and high costs have been spent in developing system LSIs due to their scale and multifunctionality. Accordingly, it is hoped that a hardware development and verification environment and software development and verification environment where a desired high-quality system LSI can efficiently be fabricated at a low cost in a short period of time will be built.

Figure 5:
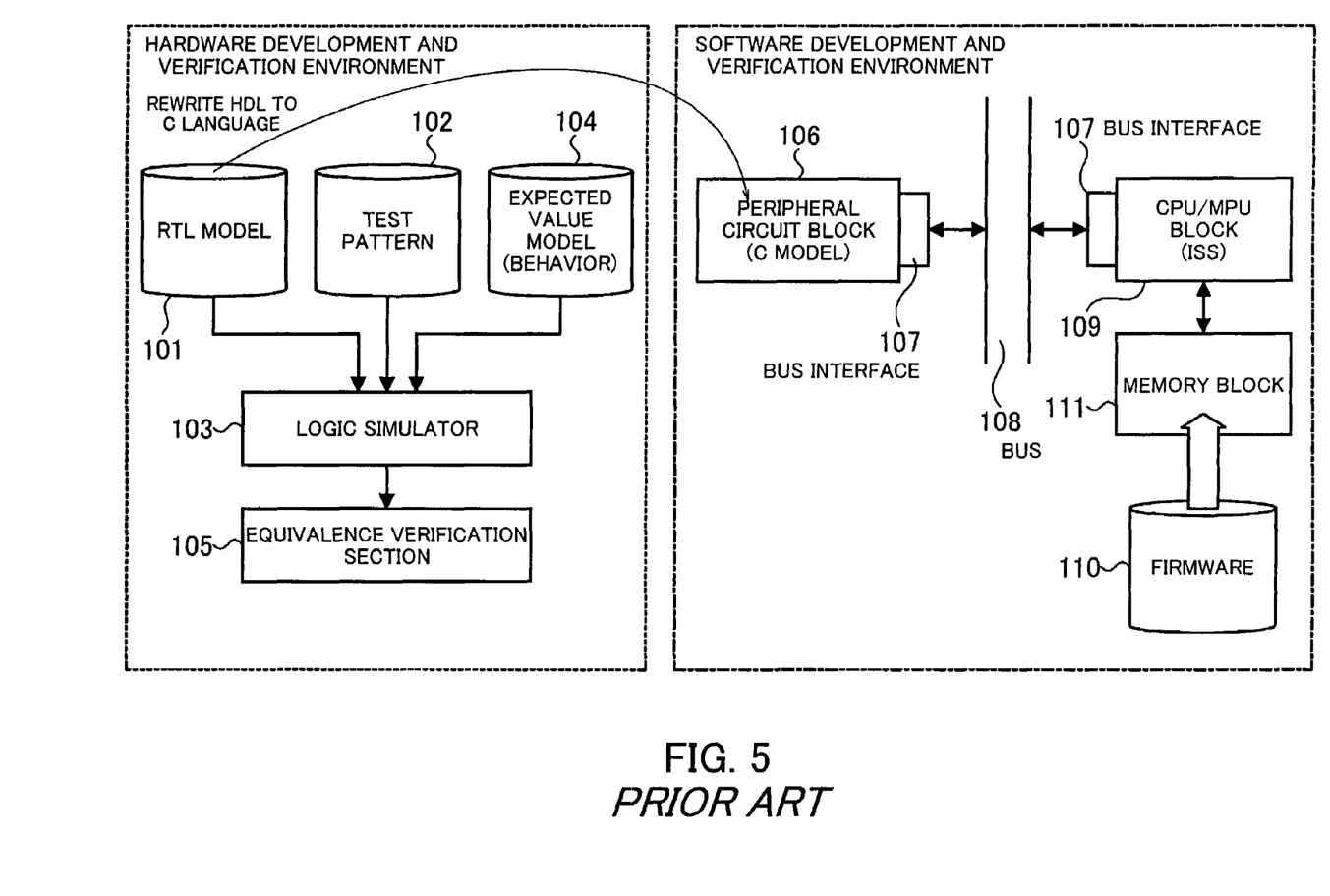
FIG. 5 is a schematic diagram of a conventional hardware development and verification environment and a conventional software development and verification environment.

FIG. 5 is a schematic diagram of a conventional hardware development and verification environment and a conventional software development and verification environment.

To develop a system LSI, LSI specifications are designed first, then a system is divided into functional modules by designing architecture on the basis of the LSI specifications, and then hardware is separated from software for controlling the hardware.

The hardware includes peripheral circuits for a central processing unit (CPU)/micro processing unit (MPU) included in the system LSI. Usually the operation of the hardware is described in a hardware description language (HDL) on the basis of a description at a behavior level of the logical function of the hardware.

Design data which represents the logical function of the hardware is described at a register transfer level (RTL) on the basis of this operation description. To verify the hardware, a hardware model (RTL model) 101 RTL-described in the HDL in this way is simulated with a test pattern 102 by a logic simulator 103.

In addition, to verify the hardware, the equivalence of the result of the simulation and an expected value obtained from a hardware model (expected value model) 104 at the behavior level, being a basis for the RTL model 101, by the use of the test pattern 102 is verified by an equivalence verification section 105. The function of the RTL model 101 is verified from the viewpoint of whether there is equivalence between the simulation result and the expected value.

Usually a time concept, such as timing with which a process is performed in the hardware, is not considered in this expected value model 104. Processes, such as logic synthesis and layout design, will be performed after the hardware verification.

On the other hand, usually the software is described in a programming language, such as C or C++. A virtual prototype is used for verifying the software. In the virtual prototype, a peripheral circuit block 106 where the operation of the peripheral circuits for the CPU/MPU is described is connected to a CPU/MPU block 109 where the operation of the CPU/MPU is described via a bus interface 107 and a bus 108 described in, for example, the C language in accordance with the LSI specifications. In addition, software (firmware) 110 to be verified is stored in a memory block 111.

To verify the software by the use of this virtual prototype, a hardware model described in the C language is needed for the peripheral circuit block 106. Usually the RTL model 101 is rewritten in the C language to generate a program (C model) and this program is used as the hardware model at the time of verifying the software. Moreover, an instruction set simulator (ISS) for performing the processing operation of the CPU/MPU is used as a software debugger. As a result, the software will be debugged in an environment which is almost the same as that of the actual circuit.

After the debugging, the verified software is stored in the actual circuit formed on the basis of the hardware verification to verify the entire system.

To reduce time taken to develop a system LSI in this way, recently co-verification in which the RTL model 101 or the expected value model 104 is simulated in synchronization with the operation of the software debugger and in which the results of execution by the software debugger and the logic simulator 103 are compared has also been performed.

Furthermore, to reduce the development period by performing the simulation at a high speed at the time of verifying the hardware, a method for switching between a low-speed fine (high time-precision) simulation performed with an RTL model and a high-speed coarse (low time-precision) simulation performed with a model at the behavior level on the basis of time precision and designated switching time is disclosed (see, for example, Japanese Unexamined Patent Publication No. 10-261002, paragraph nos. [0037]-[0092] and FIG. 1).

SUMMARY OF THE INVENTION

There is provided a verification apparatus for verifying hardware and software for controlling the hardware by the use of models. This verification apparatus uses a model including a piece of timing information indicative of a verification level at verification time and another piece of timing information different from the piece of information for verifying both the hardware and the software.

There is provided a verification method for verifying hardware and software for controlling the hardware by the use of models. In this verification method, a model including a piece of timing information indicative of a verification level at verification time and another piece of timing information different from the piece of timing information is used for verifying both the hardware and the software.

There is provided a program for making a computer verify hardware and software for controlling the hardware by the use of models. This program makes the computer perform the processes of: verifying the hardware by using a model including a piece of timing information indicative of a verification level at verification time and another piece of timing information different from the piece of timing information; and verifying the software by using the model.

The above and other features and advantages of the present invention will become apparent from the following description when taken in conjunction with the accompanying drawings which illustrate preferred embodiments of the present invention by way of example.

DESCRIPTION OF THE PREFERRED EMBODIMENTS

In the conventional methods for developing a system LSI, when an RTL model described in an HDL is rewritten in the C language to make a C model for software verification, there arises a problem about the equivalence of the C model and the RTL model.

Therefore, if a malfunction (for example, results to specifications are not obtained) occurs in the software verification, it is very difficult to specify whether the malfunction is caused by the C model which must be equivalent to the RTL model or by the software which is being verified. To specify the cause, reverification of the RTL model, the C model, and the entire system must be performed. That is to say, varification of the equivalence of the C model and the RTL model contributes to time-consuming development of a system LSI.

Furthermore, C models used for verifying software have been made according to verification levels corresponding to verification objectives because importance may be attached to, for example, verification precision or verification speed. However, if C models are made according to verification levels in this way, a vast amount of labor and time will be taken to make the models and debug the software by using them. This also decreases the efficiency of the development of a system LSI.

The present invention was made under the background circumstances described above. An object of the present invention is to provide a verification apparatus capable of accurately and efficiently verifying hardware and software used for developing a system LSI.

Another object of the present invention is to provide a verification method for accurately and efficiently verifying hardware and software used for developing a system LSI.

Still another object of the present invention is to provide a program for making a computer perform a process for accurately and efficiently verifying hardware and software used for developing a system LSI.

Embodiments of the present invention will now be described in detail with reference to the drawings.

Figure 1:
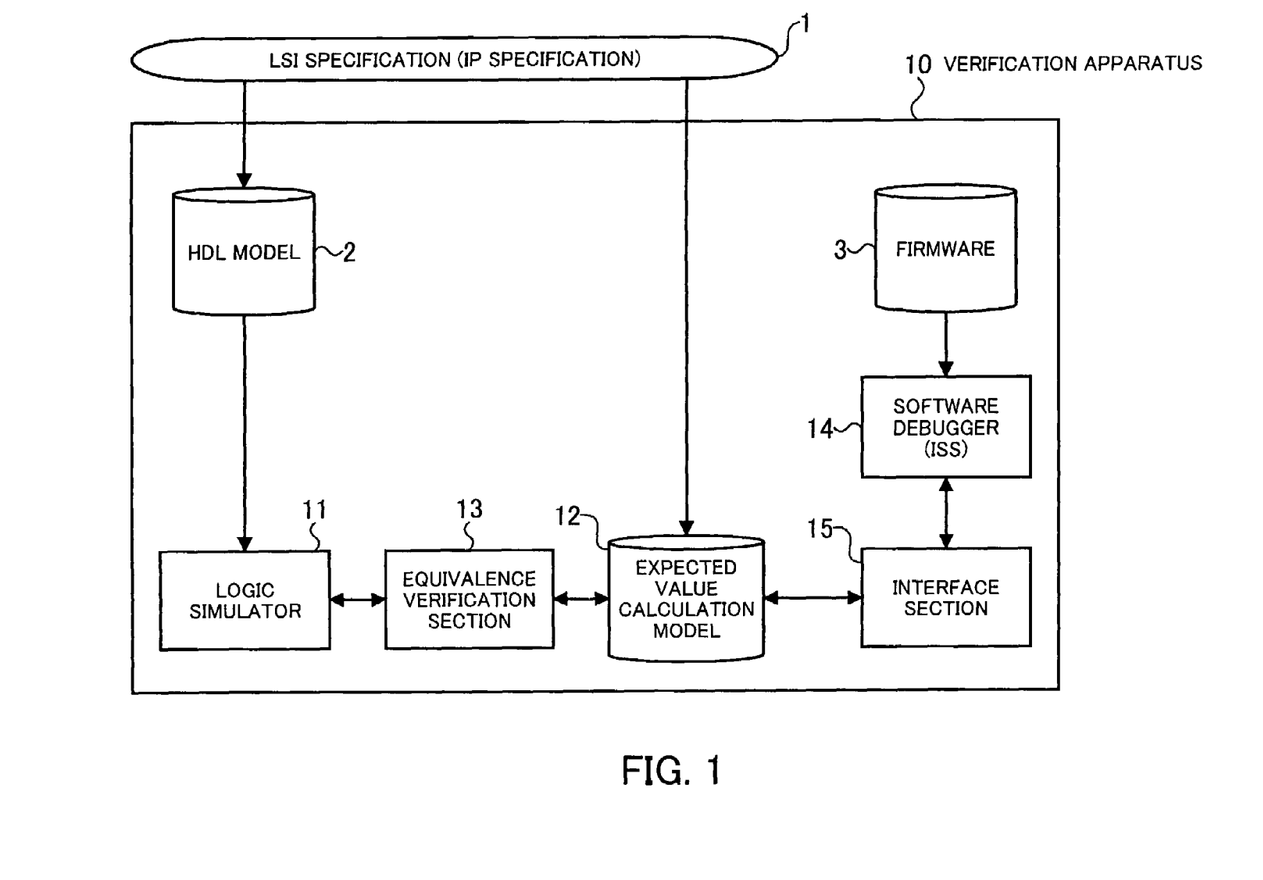
FIG. 1 shows the principles underlying the present invention.

FIG. 1 shows the principles underlying the present invention.

To develop a system LSI, LSI specifications (intellectual property (IP) specifications) 1 are designed first, then architecture is designed, then hardware is separated from software for controlling the hardware, and then the hardware and the software are designed in detail.

The hardware includes peripheral circuits for a CPU/MPU included in the system LSI. A hardware model (HDL model) 2 where the logical function of the hardware is described in an HDL, such as the very high speed integrated circuit HDL (VHDL) or the Verilog-HDL, is designed.

The software is firmware 3 including programs for making the CPU/MPU, the peripheral circuits, and the like perform predetermined processing operation. The firmware 3 stored in the system LSI is designed in a programming language, such as C or C++.

A verification apparatus 10 according to the present invention comprises the HDL model 2, the firmware 3, a logic simulator 11 for verifying the function of the HDL model 2, an equivalence verification section 13 for verifying the equivalence of the result of a simulation by the logic simulator 11 and an expected value generated from an expected value calculation model 12, a software debugger 14 for verifying the processing operation of the firmware 3, and an interface section 15 which connects the software debugger 14 and the expected value calculation model 12.

In the verification apparatus 10 having the above structure, the logic simulator 11 simulates the HDL model 2 by the use of a predetermined test pattern based on the LSI specifications 1 and generates a simulation result.

The expected value calculation model 12 includes a hardware model made in a programming language, such as C or C++, in accordance with hardware function specifications based on the LSI specifications 1. To verify the HDL model 2, this hardware model is used as an expected value generation model. In addition, to verify the firmware 3, this hardware model is used as a C model where the hardware of the system LSI is described.

The equivalence verification section 13 compares the result of the simulation of the HDL model 2 and the expected value generated from the expected value calculation model 12 by the use of the predetermined test pattern and verifies whether there is equivalence between them. If there is equivalence between them, then the HDL model 2 will be used in, for example, software verification, logic synthesis, layout design, timing verification, and tape out processes.

The software debugger 14 is an ISS for simulating the processing operation of the CPU/MPU included in the system LSI. When the software is verified, this ISS executes the firmware 3 in place of the CPU/MPU.

The interface section 15 includes an interface with the software debugger 14 and an interface with the expected value calculation model 12 where an application program interface (API) is used. As a result, the software debugger 14 can verify the firmware 3 by using the expected value calculation model 12 as the C model of the hardware via the interface section 15.

As stated above, in the hardware verification the expected value calculation model 12 is used as an expected value generation model of the HDL model 2 which includes the peripheral circuits etc. for the CPU/MPU included in the system LSI. In addition, in the software verification the expected value calculation model 12 is used as the C model which includes the peripheral circuits etc. for the CPU/MPU.

An ordinary personal computer, workstation, or the like can be used as the verification apparatus 10 for performing such hardware and software verification. In this case, each of the HDL model 2, the firmware 3, the logic simulator 11, the expected value calculation model 12, the equivalence verification section 13, the software debugger 14, the interface section 15, the test pattern, and the like takes the form of a program and is stored in a storage device, such as a hard disk, included in the verification apparatus 10 or a memory included in the verification apparatus 10. These programs are executed by the CPU or the like in the verification apparatus 10. As a result, the predetermined processing functions are realized and the verification apparatus 10 can perform the above hardware and software verification.

Figure 2:
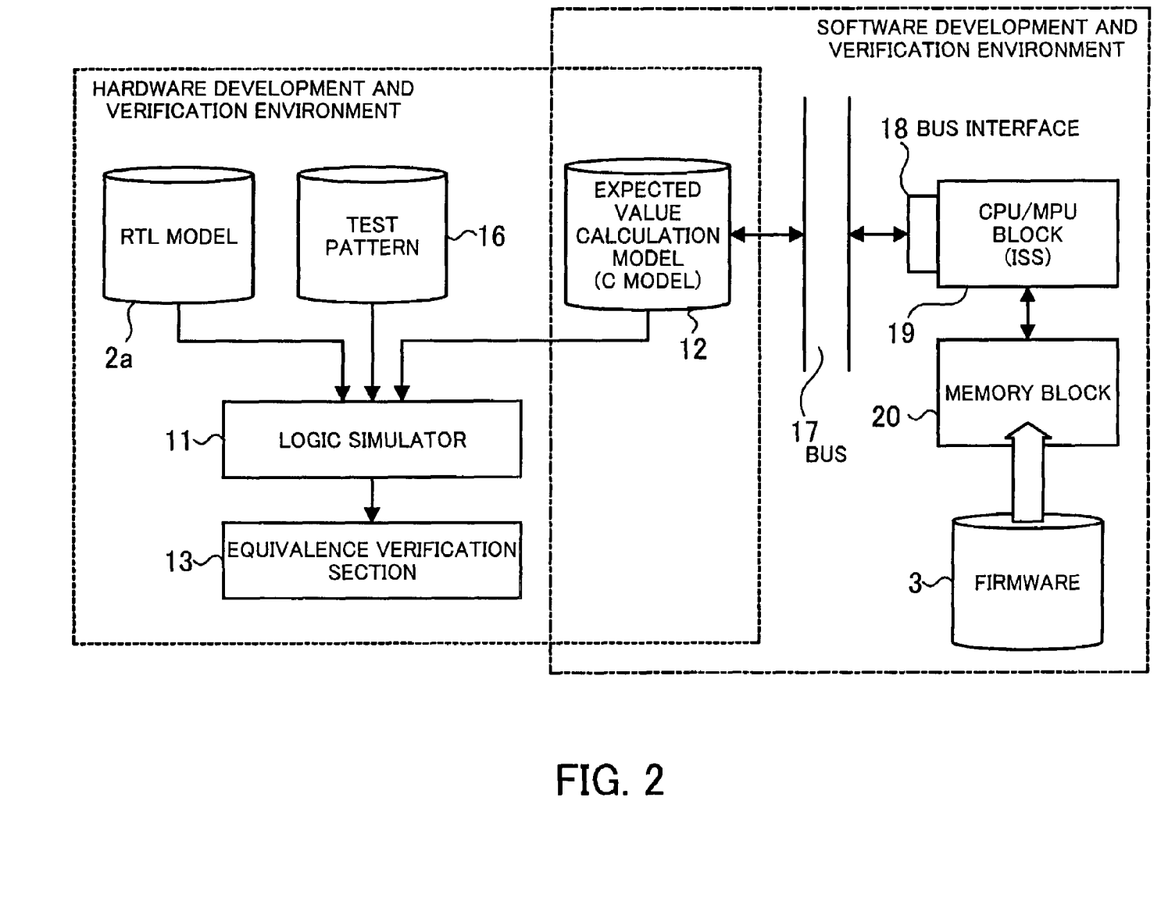
FIG. 2 is a schematic diagram of a hardware development and verification environment and a software development and verification environment.

FIG. 2 is a schematic diagram of a hardware development and verification environment and a software development and verification environment.

A hardware development and verification environment includes the expected value calculation model 12, an RTL model 2a, a test pattern 16, the logic simulator 11, and the equivalence verification section 13.

The RTL model 2a is a hardware model in which the logical function of the hardware in the system LSI is RTL-described in an HDL on the basis of the LSI specifications (IP specifications) 1. The test pattern 16 is testbench which indicates an instruction or a combination of instructions to be executed in an application the system LSI is intended for.

As shown in FIG. 2, the software development and verification environment is a virtual prototype including the expected value calculation model 12, a CPU/MPU block 19 which is connected to the expected value calculation model 12 via a bus 17 and a bus interface 18 and in which the operation of the CPU/MPU is described, and a memory block 20 which stores the firmware 3.

The bus interface 18 is described in the C language to the LSI specifications 1 in accordance with a standard, such as the universal serial bus (USB), the peripheral component interconnect (PCI), or the IEEE (Institute of Electrical and Electronics Engineers) 1394, and connects the CPU/MPU block 19 to the bus 17.

An ISS, being the software debugger 14, is used as the CPU/MPU block 19. The ISS executes the firmware 3 which is described in the C language and which is stored in the memory block 20 in place of the CPU/MPU to simulate the processing operation of the CPU/MPU.

The ISS simulates the processing operation of the CPU/MPU at one of a function accurate level, a transaction accurate level, and a cycle accurate level, which are verification levels.

At the function accurate level, the concept of time does not exist. Data is transferred per function and a simulation is performed at a high speed. At the transaction accurate level, data is transferred per event, such as a bus access, and a simulation is performed. At the cycle accurate level, data is transferred per clock and a simulation is performed.

When the software is verified, an ISS to be used is selected, depending on the object of the verification, that is to say, on whether importance is attached to verification precision or verification speed. A verification level at which the software is verified is determined by an ISS selected.

The memory block 20 functions as a RAM or a ROM in the system LSI and stores the firmware 3 which makes the CPU/MPU and the peripheral circuits operate.

The expected value calculation model 12 is connected to the CPU/MPU block 19 via the bus interface 18 described later and the bus 17.

Moreover, the expected value calculation model 12 includes pieces of timing information indicative of the function accurate level, the transaction accurate level, and the cycle accurate level respectively. For example, when a user sets a verification level corresponding to an ISS, a piece of timing information to be selected is determined. In the expected value calculation model 12, a verification level at which a simulation is to be performed is recognized from this piece of timing information and timing (per function, event, or clock) with which data is transferred at simulation time is controlled.

In the hardware development and verification environment having the above structure and the software development and verification environment having the above structure, to verify the hardware, output from the RTL model 2a described in an HDL is simulated by the logic simulator 11 by using the RTL model 2a and the test pattern 16. In addition, output from the expected value calculation model 12 described in the C language is simulated by the logic simulator 11 by using the expected value calculation model 12 and the test pattern 16 to generate an expected value. This expected value is generated by operations at a function level.

By performing these operations on the basis of information for controlling the logic simulator 11 which simulates the RTL model 2a by the use of the test pattern 16, the operation of the expected value calculation model 12 can be synchronized with that of the RTL model 2a. By synchronizing the expected value calculation model 12 with the RTL model 2a in this way and checking whether they operate the same, a hardware malfunction can be detected in the early stage.

Moreover, the expected value calculation model 12 is made in accordance with the hardware function specifications based on the LSI specifications 1, so it is suitable as a criterion for comparing with the operation of the RTL model 2a. That is to say, in conventional hardware verification there is no criterion for checking whether the RTL model 2a is functioning properly, so it is difficult to determine whether the RTL model 2a operates to specifications. However, by making the expected value calculation model 12 in accordance with the hardware function specifications, the expected value calculation model 12 can be used as a criterion for determining whether the RTL model 2a operates properly.

The equivalence verification section 13 verifies the equivalence of the result of the simulation of the RTL model 2a and the expected value obtained from the expected value calculation model 12. If the simulation result and the expected value match, then predetermined processes, such as the software verification and logic synthesis with the RTL model 2a, will be performed. If the simulation result and the expected value do not match, then the RTL model 2a and the expected value calculation model 12 will be reverified to clear up the cause of the malfunction.

After the equivalence of the output from the expected value calculation model 12 and the output from the RTL model 2a is obtained in this way, the software is verified at a verification level which depends on an ISS to be used. When the software is verified, whether the firmware 3 functions properly is verified by the use of the hardware model (C model) included in the expected value calculation model 12 and the ISS.

The expected value calculation model 12 used for the above hardware and software verification will now be described in further detail.

Figure 3:
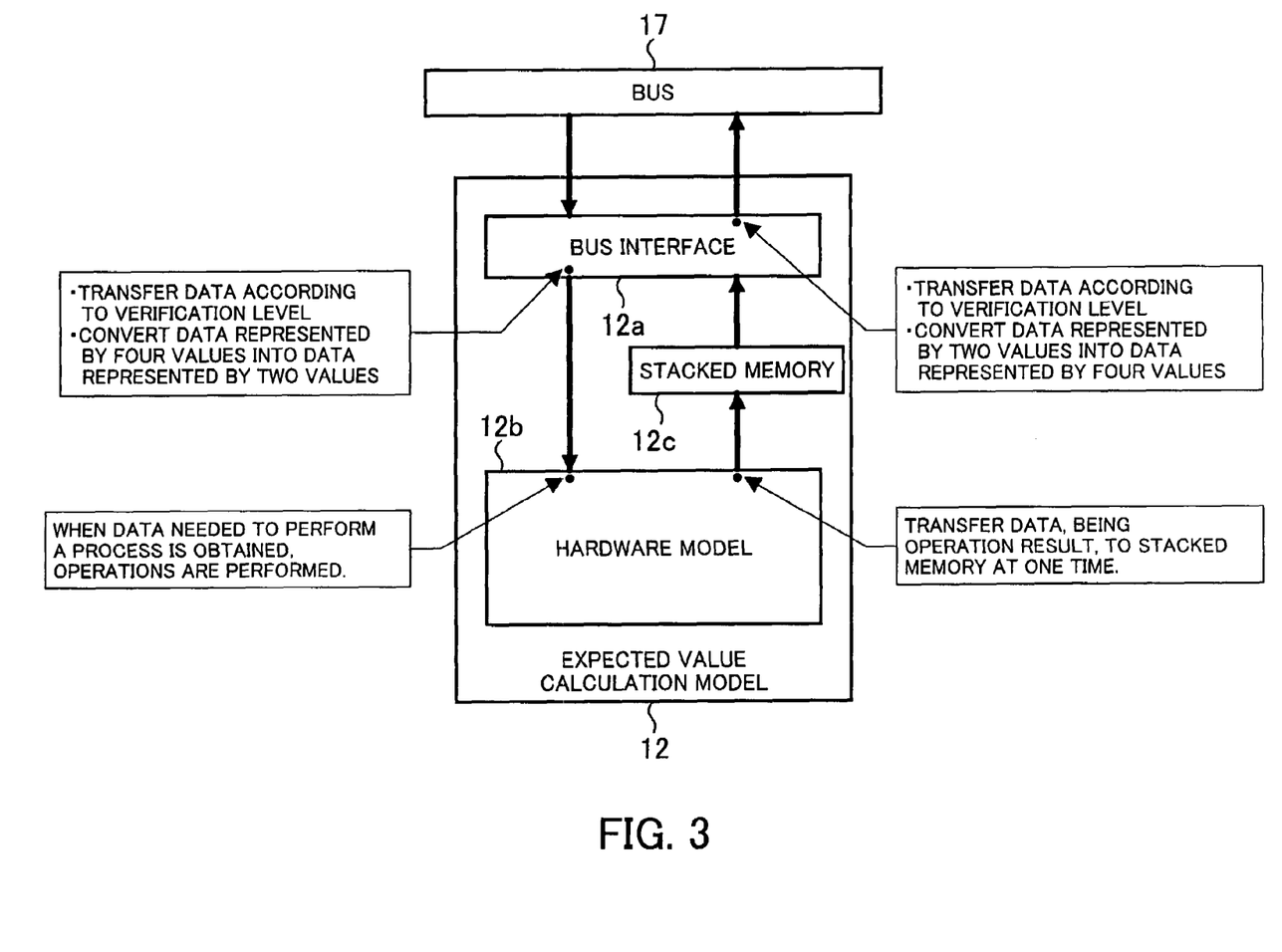
FIG. 3 shows an example of the structure of an expected value calculation model.

FIG. 3 shows an example of the structure of the expected value calculation model.

The expected value calculation model 12 includes a bus interface 12a which conforms to a standard, such as the USB, the PCI, or the IEEE 1394, and which is connected to the bus 17, a hardware model 12b which performs predetermined operations by using input data transferred from the bus interface 12a, and a stacked memory 12c in which the results of the operations performed by the hardware model 12b are stored.

The bus interface 12a can switch a system for transferring data inputted from the bus 17 to the hardware model 12b according to a piece of timing information corresponding to one of the function accurate level, the transaction accurate level, and the cycle accurate level.

That is to say, at the function accurate level, the bus interface 12a transfers all the input data that the hardware model 12b needs to perform the operations. At the transaction accurate level, the bus interface 12a transfers input data to the hardware model 12b per event, such as a bus access. At the cycle accurate level, the bus interface 12a transfers input data to the hardware model 12b per clock.

Furthermore, the bus interface 12a can switch a system for transferring data outputted from the stacked memory 12c to the bus 17 according to a piece of timing information.

That is to say, at the function accurate level, the bus interface 12a transfers all the data that is stored in the stacked memory 12c to the bus 17. At the transaction accurate level, the bus interface 12a transfers the data that is stored in the stacked memory 12c to the bus 17 per event. At the cycle accurate level, the bus interface 12a transfers the data that is stored in the stacked memory 12c to the bus 17 per clock.

The expected value calculation model 12 has the above function of switching a system for transferring data according to a piece of timing information. Accordingly, not only can the RTL model 2a be verified, but the firmware 3 can also be verified regardless of the type of an ISS. In addition, even if another software verification apparatus is used, the firmware 3 can be verified regardless of the type of the software verification apparatus.

The hardware model 12b is a model at the function level which is equivalent to the RTL model 2a in the above hardware verification, and is made in, for example, the C language included in the ANSI standard. When the RTL model 2a or the firmware 3 is verified, input data is transferred from the bus interface 12a to the hardware model 12b. When all the input data that the hardware model 12b needs to perform the predetermined operations is obtained, the operations are performed and a piece of data, being an operation result, is transferred to the stacked memory 12c. If the operation result transferred to the stacked memory 12c is made up of a group of pieces of data, then the group of pieces of data will be transferred to the stacked memory 12c at one time.

It is assumed that the hardware model 12b is made in the C language in accordance with the ANSI standard. When the hardware is verified, the values X (undefined) and Z (high impedance) of the four values (0, 1, X, and Z) used for the test pattern and the simulation can not be used in their original form for performing the operations. Therefore, the bus interface 12a converts the input data represented by the four values into the data represented by the two values 0 and 1 in accordance with a definition given by a user and transfers it to the hardware model 12b. For example, the bus interface 12a converts X (undefined) into 0 or 1, converts Z (high impedance) into 1 or 0, and transfers them to the hardware model 12b.

In the hardware model 12b, the operations are performed by using the two values 0 and 1 and data, being the result of the operations, is transferred to the stacked memory 12c.

If the data width or the bit width of data to be transferred to the bus 17 is narrower than the data width or the bit width of the input data transferred, then the bus interface 12a recognizes that the input data represented by the four values has been converted into the data represented by the two values, reconverts 0 or 1 included in the data into X or Z in accordance with the definition given by the user, and outputs the data represented by the four values to the bus 17.

The expected value calculation model 12 has the above four-values/two-values conversion function, so the hardware model 12b made in the C language in accordance with the ANSI standard can easily be used for verifying both the RTL model 2a and the firmware 3.

Furthermore, the verification apparatus 10 includes a four-values/two-values conversion section for converting a model which is represented by the four values and which is used for verifying the hardware into a model which is represented by the two values and which is used for verifying the software.

Values (U, W, L, H, or the like) other than the four values 0, 1, X, and Z may be included in the input data. In this case, these values are converted into the two values 0 and 1, the operations are performed by the hardware model 12b, and the result of the operations is reconverted and outputted. This is the same with the above case.

In addition, in the expected value calculation model 12, when the piece of data or the group of pieces of data, being the operation result, is stored in the stacked memory 12c, the piece of data or the group of pieces of data is flagged.

Figure 4:
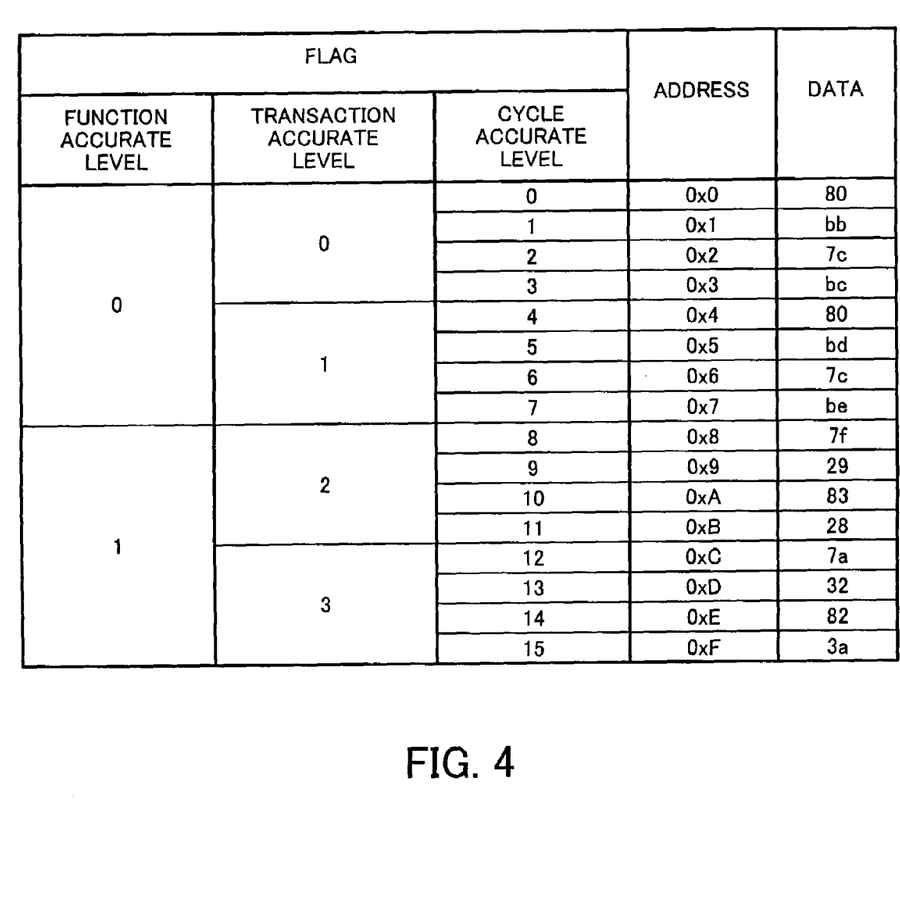
FIG. 4 shows an example of data stored in a stacked memory.

FIG. 4 shows an example of data stored in the stacked memory.

The piece of data or the group of pieces of data, being the result of the operations performed by the hardware model 12b, is transferred at one time to the stacked memory 12c in the expected value calculation model 12 and is stored into an address (addresses). In the expected value calculation model 12, a flag is defined for each piece of data or each group of pieces of data, which is stored at an address (addresses) in this way and which is to be transferred according to verification levels, as an indicator.

In this example, at the function accurate level the flags 0 and 1 are set for a group of pieces of data stored at the addresses 0x0 through 0x7 and a group of pieces of data stored at the addresses 0x8 through 0xF, respectively. The bus interface 12a identifies groups of pieces of data to be transferred to the bus 17 and the order in which these groups of pieces of data are to be transferred by these flags to control the transfer of the data to the bus 17.

That is to say, to transfer data from the stacked memory 12c at the function accurate level, the bus interface 12a first transfers the group of pieces of data at the addresses 0x0 through 0x7 for which the flag 0 is set, and then the group of pieces of data at the addresses 0x8 through 0xF for which the flag 1 is set.

At the transaction accurate level the flags 0 through 3 are set for a group of pieces of data at the addresses 0x0 through 0x3, a group of pieces of data at the addresses 0x4 through 0x7, a group of pieces of data at the addresses 0x8 through 0xB, and a group of pieces of data at the addresses 0xC through 0xF, respectively. Moreover, at the cycle accurate level the flags 0 through 15 are set for the sixteen pieces of data, respectively, stored at the addresses 0x0 through 0xF. At the transaction accurate level and the cycle accurate level, the bus interface 12a identifies groups of pieces of data or pieces of data to be transferred to the bus 17 and the order in which these groups of pieces of data or pieces of data are to be transferred by these flags to control the transfer of the data to the bus 17. This is the same with the function accurate level.

As stated above, by setting the flags for the groups of pieces of data or the pieces of data to be transferred according to verification levels and storing them, data can be transferred to the bus 17 according to verification levels. Accordingly, in the expected value calculation model 12, when the software is verified, pieces of data or groups of pieces of data can be transferred to the bus 17 at any of the function accurate level, the transaction accurate level, and the cycle accurate level.

Conventionally, different hardware models (C models) have been made according to the verification levels (the function accurate level, the transaction accurate level, and the cycle accurate level) at which software is verified, that is to say, according to ISSes used for verifying software to perform simulations. By using the above expected value calculation model 12, however, the same hardware model (C model) can be used at a plurality of verification levels or in a plurality of software verification apparatus. Therefore, simulations can be performed efficiently at a lower cost.

As has been described in the foregoing, with the verification apparatus 10 according to the present invention, the expected value calculation model 12 made for the hardware verification is reused for the software verification. Therefore, unlike conventional cases, there is no need to make a hardware model (C model) for the software verification. As a result, as long as the expected value calculation model 12 is equivalent to the RTL model 2a, a malfunction at the time of the software verification can be attributed to the firmware 3 and there is no need to verify the hardware model at the time of the software verification. This increases the efficiency of the development of a system LSI and a high-quality system LSI can be developed and fabricated at a low cost in a short period of time.

Moreover, when the expected value calculation model 12 is reused for the software verification, a system for transferring data is switched in the expected value calculation model 12 according to timing information corresponding to a software verification level. Therefore, the expected value calculation model 12 can be used for a plurality of ISSes at different verification levels. That is to say, even if a CPU or the like included in a system LSI is replaced by another, the expected value calculation model 12 can still be used as IP without making a special change therein and therefore be used very widely.

In addition, to use the expected value calculation model 12 both for the hardware verification and for the software verification, the hardware model 12b is made in the C language in accordance with the ANSI standard and the expected value calculation model 12 has a four-values/two-values conversion function. Therefore, the expected value calculation model 12 can be used more widely and be reused easily for the software verification.

The verification apparatus 10 may use the expected value calculation model 12 not including timing information for the hardware verification and use the expected value calculation model 12 to which a plurality of pieces of timing information are added for the software verification. Alternatively, the verification apparatus 10 may use the expected value calculation model 12 which includes a plurality of pieces of timing information in advance both for the hardware verification and for the software verification.

The above functions can be realized with a computer. In this case, a program in which the contents of the functions the verification apparatus 10 should have are described is provided. By executing this program on the computer, the above functions are realized on the computer. This program can be recorded on a computer readable record medium. A computer readable record medium can be a magnetic recording device, an optical disc, a magneto-optical recording medium, a semiconductor memory, or the like. A magnetic recording device can be a hard disk drive (HDD), a flexible disk (FD), a magnetic tape, or the like. An optical disc can be a digital versatile disc (DVD), a digital versatile disc random access memory (DVD-RAM), a compact disc read only memory (CD-ROM), a compact disc recordable (CD-R)/rewritable (CD-RW), or the like. A magneto-optical recording medium can be a magneto-optical disc (MO) or the like.

To place the program on the market, portable record media, such as DVDs or CD-ROMs, on which it is recorded are sold. Alternatively, the program is stored in advance on a hard disk in a server computer and is transferred from the server computer to another computer via a network.

When the computer executes this program, it will store the program, which is recorded on a portable record medium or which is transferred from the server computer, on, for example, its hard disk. Then it reads the program from its hard disk and performs processes in compliance with the program. The computer can also read the program directly from a portable record medium and perform processes in compliance with the program. Furthermore, each time the program is transferred from the server computer, the computer can perform processes in turn in compliance with the program it received.

According to the present invention, the model including a plurality of pieces of timing information indicative of verification levels at verification time is used for the hardware verification and the software verification. On the basis of these pieces of timing information, a plurality of verification processes at different verification levels can be performed by using the same model. Accordingly, there is no need to make a hardware model (C model) for the software verification and the cause of a malfunction can be cleared up efficiently. This increases the efficiency of the development of a system LSI and a high-quality system LSI can be developed and fabricated at a low cost in a short period of time.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An apparatus for verifying hardware and software for controlling the hardware, the apparatus comprising:
    a computer including a processor and memory storing a program of instructions for;
    a hardware model and an expected value calculation model of the hardware, the hardware model being verified by the computer;
    a logic simulator performing a simulation on the computer by using the hardware model and generating an expected value by using the expected value calculation model;
    an equivalence verification section verifying an equivalence of a result of the simulation and the expected value using the computer; and
    a software debugger debugging the software at different verification levels by using the expected value calculation model through an interface section, if the simulation result and the expected value match;
    wherein the expected value calculation model includes pieces of timing information, and wherein each of the pieces corresponds to a verification level of the software, and the verification level is one of a function accurate level, a transaction accurate level, or a cycle accurate level.

2. The apparatus according to claim 1, further comprising:
    a transferring unit transferring a respective piece of the pieces of timing information from the expected value calculation model to the software debugger based on the verification level of the respective piece.

3. The apparatus according to claim 1, wherein:
    the expected value calculation model includes a data conversion section converting input data to the expected value calculation model for performing an expected value calculation operation and reconverting a result of the operation performed by using the input data converted,
    the result of the operation reconverted is outputted from the expected value calculation model.

4. A method comprising:
   verifying on a computer including a processor and memory an equivalence of a result of a simulation performed on a computer including a processor and memory by using a hardware model of hardware and an expected value generated by using an expected value calculation model; and
   debugging on the computer software for controlling the hardware by using the expected value calculation model through an interface section, if the simulation result and the expected value match;
   wherein the expected value calculation model includes pieces of timing information, and wherein each of the pieces corresponds to a verification level of the software, and the verification level is one of a function accurate level, a transaction accurate level, or a cycle accurate level.

5. The method according to claim 4, further comprising:
   transferring a respective piece of the pieces of timing information from the expected value calculation model to be used in said debugging based on the verification level of the respective piece.

6. The method according to claim 4, further comprising:
   converting input data to the expected value calculation model for performing an expected value calculation operation and reconverting a result of the operation performed by using the input data converted; and
   outputting the result of the operation reconverted from the expected value calculation model.

7. A computer readable record medium having embodied thereon computer executable instructions which when executed on a computer perform a method, the medium comprising instructions for:
   verifying an equivalence of a result of a simulation performed by using a hardware model of hardware and an expected value generated by using an expected value calculation model; and
   debugging the software at different verification levels for controlling the hardware by using the expected value calculation model through an interface section, if the simulation result and the expected value match;
   wherein the expected value calculation model includes pieces of timing information, and wherein each of the pieces corresponds to a verification level of the software, and the verification level is one of a function accurate level, a transaction accurate level, or a cycle accurate level.

8. The computer readable record medium according to claim 7 having embodied thereon instructions causing a computer to further perform:
   transferring a respective piece of the pieces of timing information from the expected value calculation model to be used in said debugging based on the verification level of the respective piece.

9. The computer readable record medium according to claim 7, having embodied thereon instructions causing a computer to further perform:
   converting input data to the expected value calculation model for performing an operation, and reconverting a result of the operation performed by using the input data converted; and
   outputting the result of the operation reconverted from the expected value calculation model.

10. An apparatus comprising:
    means for verifying an equivalence of a result of a simulation performed by using a hardware model of hardware and an expected value generated by using an expected value calculation model; and
    means for debugging software at different verification levels for controlling the hardware by using the expected value calculation model through an interface section, if the simulation result and the expected value match;
    wherein the expected value calculation model includes pieces of timing information, and wherein each of the pieces corresponds to a verification level of the software, and the verification level is one of a function accurate level, a transaction accurate level, or a cycle accurate level.

* * * * *